United States Patent
Han et al.

(10) Patent No.: US 7,326,519 B2
(45) Date of Patent: *Feb. 5, 2008

(54) PHOTOSENSITIVE RESIN, PHOTORESIST COMPOSITION HAVING THE PHOTOSENSITIVE RESIN AND METHOD OF FORMING A PHOTORESIST PATTERN USING THE PHOTORESIST COMPOSITION

(75) Inventors: Seok Han, Gyeonggi-do (KR); Sangwoong Yoon, Seoul (KR); Young-Ho Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 39 days.

This patent is subject to a terminal disclaimer.

(21) Appl. No.: 11/350,559

(22) Filed: Feb. 8, 2006

(65) Prior Publication Data

US 2006/0188821 A1    Aug. 24, 2006

(30) Foreign Application Priority Data

Feb. 18, 2005    (KR) .................... 10-2005-0013598

(51) Int. Cl.
G03C 1/76 (2006.01)
G03C 1/492 (2006.01)
G03C 1/494 (2006.01)
G03C 5/00 (2006.01)

(52) U.S. Cl. .................. 430/270.1; 430/311
(58) Field of Classification Search ............ 430/270.1, 430/311
See application file for complete search history.

(56) References Cited

U.S. PATENT DOCUMENTS

2006/0016020 A1 * 1/2006 Park .......................... 8/158
2006/0160019 A1 * 7/2006 Wang et al. ............. 430/270.1

FOREIGN PATENT DOCUMENTS

| JP | 2004-026981 | 1/2004 |
| KR | 2003-0087190 | 11/2003 |
| KR | 2004-0034717 | 4/2004 |

OTHER PUBLICATIONS

English language abstract of Korean Publication No. 2003-0087190.
English language abstract of Korean Publication No. 2004-0034717.
English language abstract of Japanese Publication No. 2004-026981.

* cited by examiner

*Primary Examiner*—Geraldina Visconti
(74) *Attorney, Agent, or Firm*—Marger Johnson & McCollom, P.C.

(57) ABSTRACT

In a photosensitive resin, a photoresist composition including the photosensitive resin and a method of forming a photoresist pattern using the photoresist composition, the photosensitive resin includes a hydrophobic terminal group having at least five carbon atoms and a blocking group. The photosensitive resin has a weight average molecular weight of from about 6,000 up to about 9,500. The photoresist composition including the photosensitive resin may form a photoresist pattern having a reduced line edge roughness and a fine line width with accuracy.

19 Claims, 3 Drawing Sheets

PHOTOSENSITIVE RESIN, PHOTORESIST COMPOSITION HAVING THE PHOTOSENSITIVE RESIN AND METHOD OF FORMING A PHOTORESIST PATTERN USING THE PHOTORESIST COMPOSITION

CROSS REFERENCE TO RELATED APPLICATION

This application claims priority under 35 USC § 119 to Korean Patent Application No. 2005-0013598 filed on Feb. 18, 2005, the contents of which are herein incorporated by references in its entirety.

BACKGROUND OF THE INVENTION

1. Field of the Invention

Embodiments of the present invention relate to a photosensitive resin, a photoresist composition having the photosensitive resin, and a method of forming a photoresist pattern using the photoresist composition.

2. Description of the Related Art

Recently, as information technology such as a computer is spreaded rapidly, semiconductor devices have been developed swiftly. Semiconductor devices having high integration degree and rapid response speed are desired in functional aspects. Hence, the technology of manufacturing the semiconductor devices has been developed to improve integration degree, reliability and response speed of the semiconductor devices. Particularly, the requirements for a microprocessing technology such as a photolithography process have become strict.

In a semiconductor manufacturing process, a photoresist composition is used in the photolithography process. Solubility of the photoresist composition varies with respect to a developing solution in accordance with exposure to light. Thus, a desired pattern is obtained by coating the photoresist composition to form a photoresist film, selectively exposing the photoresist film to light and developing the exposed portion of the photoresist film.

In the semiconductor device having a design rule of about 240 nm, the roughness deviation of the photoresist pattern is about 20 nm, so that a line width roughness of about 16 percent exists. However, as the design rule of the semiconductor device has shrunk below about 90 nm, the roughness width of the photoresist pattern has increased to 22 percent, particularly in the semiconductor device having a design rule of below about 70 nm, the line width roughness has increased to over 29 percent.

Until recently, for improving the profile of the photoresist pattern, a molecular weight of a photosensitive resin or a kind of a blocking group included in the photoresist composition have been mainly changed. However, when these photoresist compositions are used, occasional loss of the photoresist pattern increases a number of developing processes or the physical properties of the photosensitive resin are deteriorated. This is because the size of the photosensitive resin is not considered in improving characteristics of the photoresist composition.

Therefore, a need still exists for a photoresist composition capable of forming a photoresist film having a uniform profile, for preventing the photoresist pattern from swelling in a developing process and a cleaning process, and for providing good reproducibility and high resolution.

SUMMARY OF THE INVENTION

Embodiments of the present invention provide a photosensitive resin having a good reproducibility and high resolution. Embodiments of the present invention also provide a photoresist composition including the photosensitive resin. Further embodiments of the present invention provide also a method of forming a photoresist pattern using the photoresist composition.

A photosensitive resin is provided. The photosensitive resin comprises a hydrophobic terminal group having at least five carbon atoms, and a blocking group. The hydrophobic terminal group is selected from the group consisting of a chain hydrocarbon group, an aromatic hydrocarbon group, an alkyl group, a chain hydrocarbon group having an oxyalkylene group and an aromatic hydrocarbon group having an oxyalkylene group. The hydrophobic terminal group is selected from the group consisting of hydrophobic groups represented by the following formulas (1) to (6):

(1)

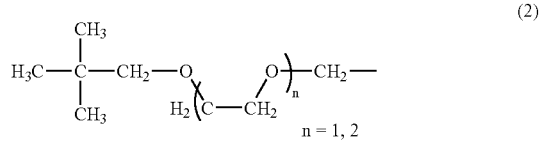
(2)

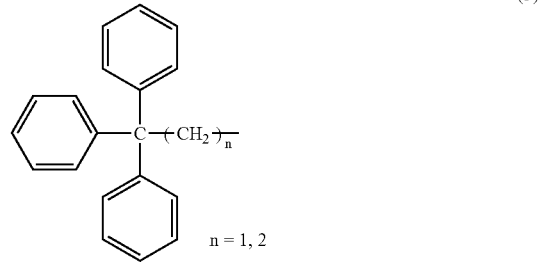
(3)

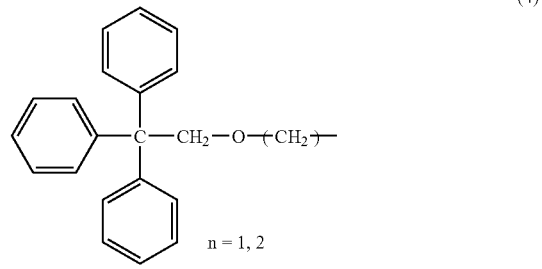
(4)

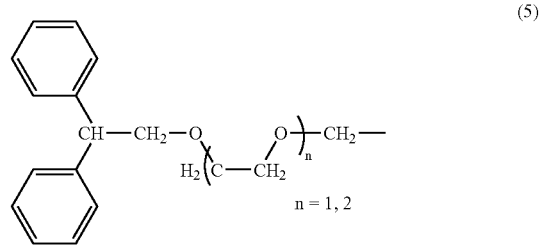
(5)

-continued

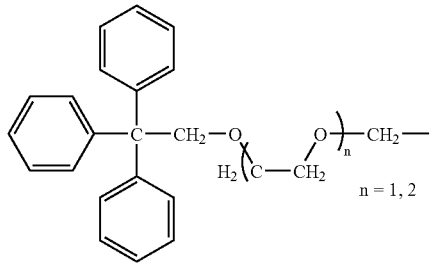

(6)

n = 1, 2

The photosensitive resin includes at least one selected from the group consisting of an acrylate resin, a vinyl ether maleic anhydride (VEMA) resin, a cyclo olefin maleic anhydride (COMA) resin and a cyclo olefin (CO) resin. The photosensitive resin has a weight average molecular weight of from about 6,000 up to about 9,500, and preferably from about 6,300 up 10 to about 8,500.

A photoresist composition includes a photosensitive resin including at least five carbon atoms and a blocking group. The photosensitive resin has a weight average molecular weight as described above. The photoresist composition also includes a photoacid generator, and an organic solvent. The photoresist composition preferably comprises from about 4 up to about 10 percent by weight of the photosensitive resin, from about 0.1 up to about 1 percent by weight of the photoacid generator and a remainder of the organic solvent.

The photoacid generator is selected from the group consisting of triarylsulfonium salt, diaryliodonium salt, sulfonate and N-hydroxysuccinimide triflate. The organic solvent is selected from the group consisting of ethyleneglycolmonomethylether, ethyleneglycolmonoethylether, propyleneglycolmethylether, methylcellosolveacetate, ethylcellosolveacetate, diethyleneglycolmonomethylether, diethyleneglycolmonoethylether, propyleneglycolmethyletheracetate, propyleneglycolpropyletheracetate, diethyleneglycoldimethylether, ethyl lactate, toluene, xylene, methylethylketone, cyclohexanone, 2-heptanone, 3-heptanone and 4-heptanone.

A method of forming a photoresist pattern can also be provided. The method comprises forming a photoresist film on an object by coating a photoresist composition that includes the photosensitive resin, a photoacid generator and an organic solvent, wherein the photosensitive resin includes a blocking group and a hydrophobic terminal group that has at least five carbon atoms, and has a weight average molecular weight of from about 6,000 up to about 9,500. Then, the photoresist film is exposed to light, and an exposed portion of the photoresist film is developed. The photosensitive resin includes polymers which preferably have a grain size of from about 15 nm up to about 20 nm.

The hydrophobic terminal group may serve to reduce a size of the photosensitive resin. When a photoresist pattern is formed using a photoresist composition of the present invention, the photoresist pattern may have improved characteristics. Thus, the photoresist pattern may have a reduced line edge roughness and the photoresist pattern having a fine line width may be formed exactly. In addition, a photoresist pattern having a substantially uniform thickness may be obtained.

BRIEF DESCRIPTION OF THE DRAWINGS

The above and other features and advantages of the present invention will become more apparent by describing in detailed example embodiments thereof with reference to the accompanying drawings, in which.

DETAILED DESCRIPTION

Figure 1:
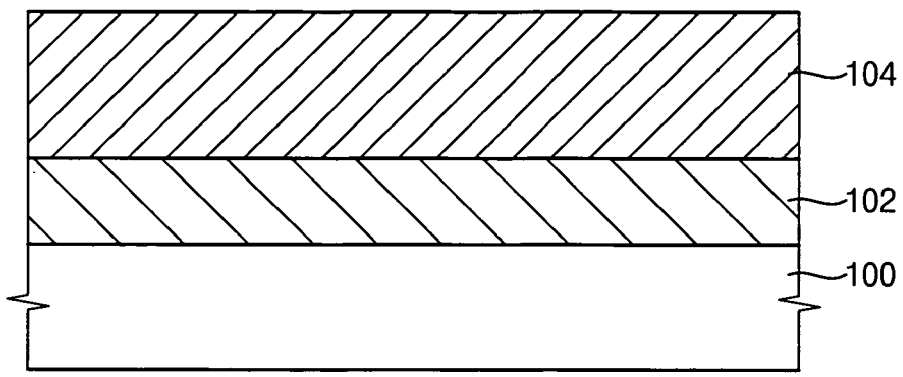
FIGS. 1 to 3 are cross-sectional views illustrating a method of forming a photoresist pattern in accordance with an example embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Photosensitive Resin

A photosensitive resin of the present invention includes a hydrophobic terminal group and a blocking group.

In one embodiment of the present invention, the photosensitive resin may further include an adhesion group, a wetting group and/or an etching resistant group.

The photosensitive resin may also comprise a plurality of polymers. The size of the polymer composing the photosensitive resin may be changed as a chemical structure, a physical state of the polymer or an environment which the polymer exists in. The polymer may exist as a random coil structure in a solvent. Hence, the size of the polymer is measured by a radius of gyration (Rg). The radius of gyration is calculated by the following Equation (1).

Radius of gyration $(Rg) = (r^2/6)^{1/2}$      Equation (1)

(in which r represents distances between monomers composing the polymer and a center of gravity of the polymer.)

However, the size of the polymer may be changed according to many factors such as the bond angle and the rotation angle between chains of the polymer, the interaction between the solvent and the polymer, the interaction between the polymer and the polymer, the intrinsic volume of the polymer, the temperature of surroundings, etc. Thus, the size of the polymer may swell or shrink as the factors or a combination thereof.

A hydrophobic terminal group may be included at an end of the polymer having the random coil structure. In a developing process and a cleaning process, the hydrophobic terminal group may reduce the hydrodynamic volume of the polymer in the developing solution so that an expansion of the polymer in the developing solution may be reduced. Thus, damage to the upper portion of a photoresist pattern due to the expansion of the polymer may be reduced so that the photoresist pattern having a uniform shape may be formed.

The hydrophobic terminal groups may be changed according to an initiator that is used to form the polymer by a polymerization.

Examples of the hydrophobic terminal groups may include a chain hydrocarbon group having at least five carbon atoms, a chain hydrocarbon group having an oxyalkylene group, an aromatic hydrocarbon group, an aromatic hydrocarbon group having an oxyalkylene group, an alkyl group, etc.

Particularly, examples of the hydrophobic terminal group may include hydrophobic groups represented by the following structural formulas (1) to (6), etc.

(1)

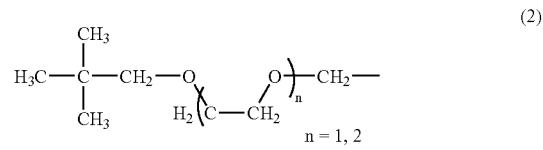

(2)

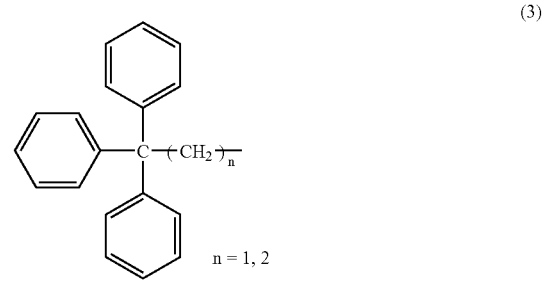

(3)

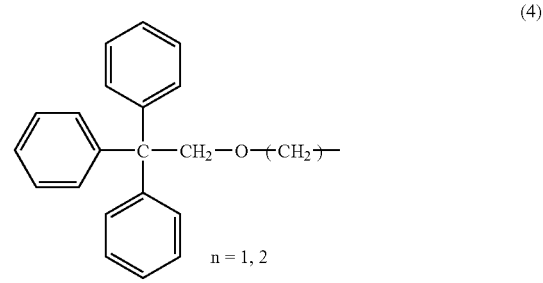

(4)

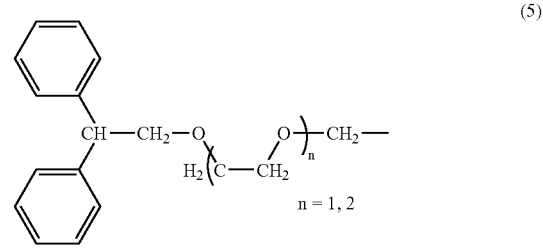

(5)

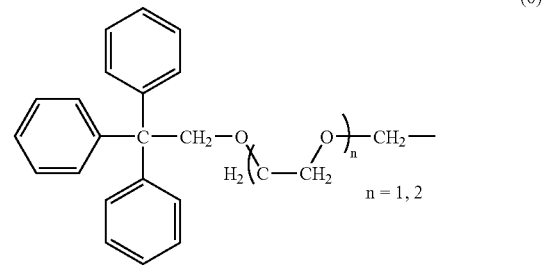

(6)

The alkyl group and the aromatic hydrocarbon group are hydrophobic. The oxyethylene group may increase the hydrophobic properties of the polymer having the random coil structure. That is, the oxyethylene group may concentrate the polymer onto a center of the polymer to reduce the volume of the polymer in the developing solution.

When the photosensitive resin of the present invention has a weight average molecular weight of less than about 6,000, the depth of focus may be reduced and a line edge roughness also may be deteriorated because of an increased loss of the photosensitive resin in a developing process. In addition, chemical and physical properties of a photoresist pattern that is formed by a photoresist composition including the photosensitive resin may be deteriorated. When the photosensitive resin has the weight average molecular weight of more than about 9,500, the photosensitive resin may have polymers having a grain size of more than about 31 nm, so that a line of the photoresist pattern may be not uniform in a semiconductor device having a design rule of less than about 80 nm.

Therefore, the photosensitive resin of the present invention may preferably have a weight average molecular weight of from about 6,000 up to about 9,500, and more preferably a weight average molecular weight of from about 6,300 up to about 8,500. Still more preferably, the photosensitive resin of the present invention may have a weight average molecular weight of from about 6,700 up to about 8,000.

When the photosensitive resin includes polymers having a grain size of less than about 15 nm, the depth of focus may be reduced and a loss of the photosensitive resin may increase in the developing process. In addition, when the photosensitive resin includes polymers having the grain size of more than about 20 nm, the photoresist pattern that is formed by a photoresist composition including the photosensitive resin may not have a uniform line.

The grain size of the polymer of the photosensitive resin (Rs) is defined as the following Equation (2).

$$Rs = K \cdot Mn \qquad \text{Equation (2)}$$

(in which the K represents a proportional constant and Mn represents a weight average molecular weight of the photosensitive resin.)

Thus, the photosensitive resin may preferably include polymers having a grain size of from about 15 nm up to about 20 nm, more preferably from about 15 nm up to about 18 nm.

In order to regulate the weight average molecular weight of the photosensitive resin or the grain size of the polymer, the introduction amount, the reaction time and/or the reaction temperature of monomers that are used to form the photosensitive resin may be controlled.

The photosensitive resin of the present invention includes a blocking group. The blocking group may serve to protect the photosensitive resin from an acid ($H^+$) generated from a photoacid generator and from energy having a predetermined level. The blocking group may also be referred to as a protecting group.

Examples of the photosensitive resin of the present invention may include an acrylate resin, a vinyl ether maleic anhydrid (VEMA) resin, a cyclo olefin maleic anhydride (COMA) resin, a cyclo olefin (CO) resin, etc. The acrylate resin may include a methacrylate resin.

The photosensitive resin of the present invention may not swell and be removed in a developing process and a cleaning process, so that the photoresist pattern that is formed by the photoresist composition including the photosensitive resin may have a uniform structure.

Photoresist Composition

A photoresist composition of the present invention includes a photosensitive resin including a hydrophobic terminal group having at least five carbon atoms, a photoacid generator and an organic solvent.

When the photoresist composition includes less than about one percent by weight of the photosensitive resin, forming a photoresist pattern may not be easily controlled. In addition, when the photoresist composition includes more than about 10 percent by weight of the photosensitive resin, a photoresist film having a uniform thickness may not be formed. Thus, the photoresist composition of the present invention may preferably include from about 1 up to about 10 percent by weight of the photosensitive resin. In particular, when the photoresist pattern having a fine line width of less than about 100 nm is formed, the photoresist composition of the present invention may more preferably include from about 1 up to about 5 percent by weight of the photosensitive resin.

In the photoresist composition of the present invention, hydrophobic terminal groups which are included in the photosensitive resin may include a chain hydrocarbon group having at least five carbon atoms, a chain hydrocarbon group having an oxyalkylene group, an aromatic hydrocarbon group, an aromatic hydrocarbon group having an oxyalkylene group, an alkyl group, etc.

Examples of the hydrophobic terminal group may include hydrophobic groups represented by the following formulas (1) to (6), etc.

(1)

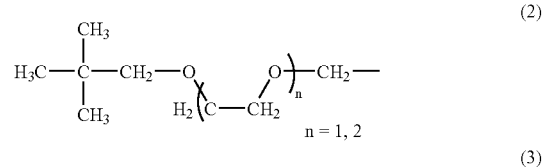

(2)

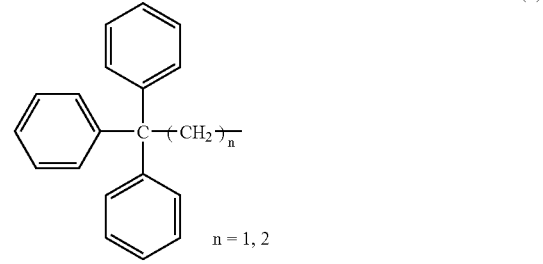

(3)

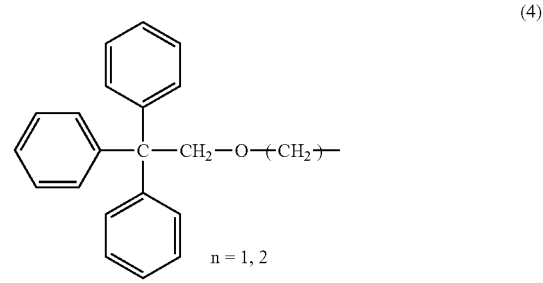

(4)

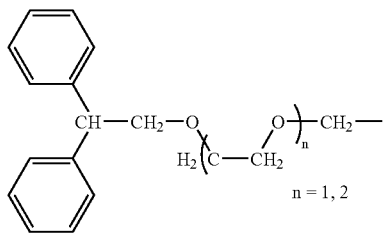

(5)

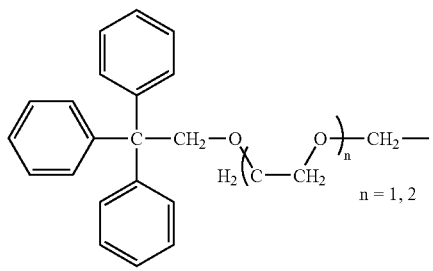

(6)

The hydrophobic terminal group is included at an end of the photosensitive resin. Hence, the hydrophobic terminal groups may reduce the hydrodynamic volume of the photosensitive resin in a developing solution in a developing process and a cleaning process to suppress expansion of the photosensitive resin in a developing solution. Thus, damage to the upper portion of the photoresist pattern due to the expansion of the photosensitive resin may be reduced, so that the photoresist pattern has a uniform shape. The hydrophobic terminal group may be changed according to the initiator that is used to form the photosensitive resin by polymerization.

The photosensitive resin of the present invention may preferably have a weight average molecular weight of from about 6,000 up to about 9,500, and more preferably a weight average molecular weight of from about 6,300 up to about 8,500. Still more preferably, the photosensitive resin may have a weight average molecular weight of from about 6,700 up to about 8,000.

In addition, the photosensitive resin may preferably include polymers having a grain size of about 15 nm to about 20 nm, more preferably polymers having the grain size of about 15 nm to about 18 nm.

In the photoresist composition of the present invention, the photosensitive resin may not react with the organic solvent. Additionally, the photosensitive resin may have sufficient solubility and a proper drying rate so that a photoresist film having a uniform thickness is formed after an evaporation of the organic solvent.

Examples of the photosensitive resin of the present invention include an acrylate resin, a vinyl ether maleic anhydride (VEMA) resin, a cyclo olefin maleic anhydride (COMA) resin, a cyclo olefin (CO) resin, etc. These can be used alone or in a mixture thereof. The acrylate resin may include a methacrylate resin.

In the photoresist composition of the present invention, the photosensitive resin includes a blocking group. The blocking group is easily removed by an acid ($H^+$) and an energy having predetermined level.

As described above, in the photoresist composition of the present invention, the photosensitive resin includes at least one hydrophobic terminal group at each end and has a weight average molecular weight of from about 6,000 up to about 9,500. A conventional photoresist composition includes a photoresist resin having a weight average molecular weight of more than about 10,000. Therefore, using the photoresist composition including the photosensitive resin of the present invention, a photoresist pattern having a uniform line may be formed.

In the photoresist composition of the present invention, an acid ($H^+$) and heat may be employed to separate the blocking group from the photosensitive resin. The acid may be generated by a photoacid generator included in the photoresist composition. The photoacid generator is material that generates the acid by accepting light.

When the photoresist composition includes less than about 0.1 percent by weight of the photoacid generator, generation of the acid may be reduced in a light-exposure process so that the blocking group in the photosensitive resin may be not separated enough. When the content of the photoacid generator is more than about one percent by weight, the acid may be generated excessively in the light-exposure process so that a photoresist film may be developed excessively in a developing process to bring a heavy loss on an upper portion of the photoresist pattern. Thus, the photoresist composition of the present invention may preferably have the photoacid generator of from about 0.1 up to about 1 percent by weight, more preferably from about 0.3 up to about 0.7 percent by weight.

Examples of the photoacid generator may include triarylsulfonium salt, diaryliodonium salt, sulfonate, N-hydroxysuccinimide triflate, etc. These can be used alone or in a mixture thereof.

Examples of the photoacid generator may include triphenylsulfonium triflate, triphenylsulfonium antimony salt, diphenyliodonium triflate, diphenyliodonium antimony salt, methoxydiphenyliodonium triflate, di-tert-butyldiphenyliodonium triflate, 2,6-dinitrobenzyl sulfonate, pyrogallol tris (alkylsulfonate), norbornene-dicarboxyimide triflate, triphenylsulfonium nonaflate, diphenyliodonium nonaflate, methoxydiphenyliodonium nonaflate, di-tert butyldiphenyliodonium nonaflate, N-hydroxysuccinimide nonaflate, norbornene dicarboxyimide nonaflate, triphenylsulfonium perfluorooctanesulfonate, diphenyliodonium perfluorooctanesulfonate, methoxyphenyliodonium perfluorooctanesulfonate, di-tert-butyldiphenyliodonium triflate, N-hydroxysuccinimide perfluorooctanesulfonate, norbornene dicarboxyimide perfluorooctanesulfonate, etc. These can be used alone or in a mixture thereof.

The photoresist composition of the present invention includes an organic solvent. Examples of the preferred organic solvent may include ethyleneglycolmonomethylether, ethyleneglycolmonoethylether, propyleneglycolmethylether, methylcellosolveacetate, ethylcellosolveacetate, diethyleneglycolmonomethylether, diethyleneglycolmonoethylether, propyleneglycolmethyletheracetate, propyleneglycolpropyletheracetate, diethyleneglycoldimethylether, ethyl lactate, toluene, xylene, methylethylketone, cyclohexanone, 2-heptanone, 3-heptanone, 4-heptanone, etc. These can be used alone or in a mixture thereof.

The photoresist composition of the present invention may further include an organic base as a preferred additive (quencher). The organic base may prevent the photoresist pattern from being affected by a basic compound such as an amine in an atmosphere, and may serve to control a shape of the photoresist pattern.

Examples of the preferred organic base may include triethylamine, triisobutylamine, triisooctylamine, triisodecylamine, diethanolamine, triethanolamine, etc. These can be used alone or in a mixture thereof.

In an embodiment of the present invention, the photoresist composition may preferably include from about 0.01 up to about 1 part by weight of the organic base, based on about 100 parts by weight of the photoresist composition. When the photoresist composition further includes the preferred organic base, the photoresist composition may include from about 1 up to about 10 percent by weight of the photosensitive resin, from about 0.01 up to about 1 percent by weight of the photoacid generator, from about 0.0099 up to about 1.01 percent by weight of the organic base, and the remainder of the organic solvent.

The photoresist composition of the present invention may further include an additive such as a surfactant, a sensitizer, an adhesive, a preservation stabilizer or the like.

Method of Forming a Photoresist Pattern

Figure 2:
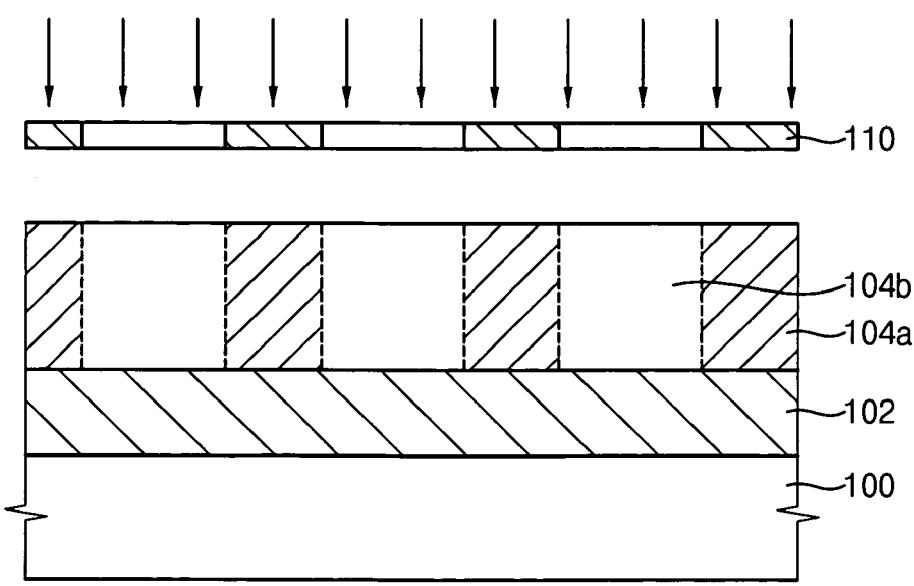
Figure 3:
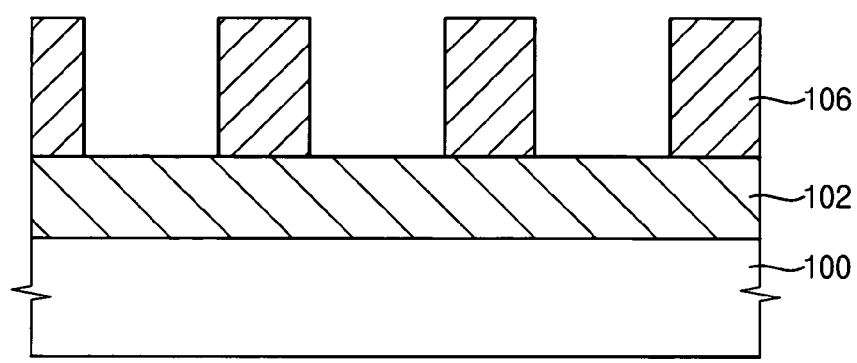

FIGS. 1 to 3 are cross-sectional views illustrating a method of forming a photoresist pattern in accordance with an embodiment of the present invention.

Referring to FIG. 1, an object to be patterned is prepared. For example, a thin film 102 formed on a substrate 100 is used as the object. A surface treatment process may be performed for the thin film 102 to remove contaminants remaining on the thin film 102.

A photoresist film 104 is formed on the thin film 102 by coating a photoresist composition in accordance with an embodiment of the present invention. The photoresist composition may include a photosensitive resin, a photoacid generator and an organic solvent. The photosensitive resin may include a hydrophobic terminal group having at least of five carbon atoms and a blocking group. In addition, the photosensitive resin may comprise a weight average molecular weight of from about 6,000 up to about 9,500.

A first baking process may be performed for the substrate 100 including the photoresist film 104 thereon. The first baking process may be performed at a temperature of from about 90° C. up to about 120° C. The first baking process may enhance an adhesive characteristic of the photoresist film 104.

Referring to FIG. 2, the photoresist film 104 is exposed to light. Particularly, a mask 110 on which a predetermined pattern is formed is positioned on a mask stage of an exposure apparatus. The mask 110 is arranged over the substrate 100 having the photoresist film 104 in an alignment process. Light is irradiated onto the mask 110 for a desirable time so that a portion of the photoresist film 104 may be reacted with light through the mask 110. The light may include a laser of krypton fluoride (KrF) having a wavelength of about 248 nm, a laser of argon fluoride (ArF) having the wavelength of about 193 nm, etc.

An exposed portion 104b of the photoresist film 104 may be more hydrophilic with respect to an unexposed portion 104a of the photoresist film 104. Thus, the unexposed portion 104a and the exposed portion 104b of the photoresist film 104 may have a different solubility.

A second baking process may be performed for the substrate 100. The second baking process may be performed at a temperature of from about 90° C. up to about 150° C. The exposed portion 104b may be readily dissolved in a particular solvent by the second baking process.

Referring to FIG. 3, the exposed portion 104b of the photoresist film 104 is dissolved using a developing solution and removed to form a photoresist pattern 106. For example, the exposed portion 104b is dissolved using the developing solution such as a weak base, deionized water, etc.

The photosensitive resin included in the photoresist composition has a random coil structure and a hydrophobic terminal group at an end of the photosensitive resin. In a developing process and a cleaning process, the hydrophobic terminal group may reduce the hydrodynamic volume of the photosensitive resin in the developing solution, so that expansion of the photosensitive resin in the developing solution may be reduced. Thus, damage of the upper portion of the photoresist pattern 106 due to the expansion of the photosensitive resin may be reduced, so that the photoresist pattern 106 having a uniform shape may be formed. Hence, the photoresist pattern 106 may have a uniform line because the photoresist pattern 106 has a substantially reduced loss to the edge.

A process such as a cleaning process may be further performed for the substrate 100 including the photoresist pattern 106. Various structures of a semiconductor device may be formed using the photoresist pattern 106 as a mask.

The photoresist composition of the present invention will be further described in the Example and Comparative Example.

Preparation of the Photoresist Composition

EXAMPLE

A photoresist composition was prepared by mixing about 5 percent by weight of methacrylate resin as a photosensitive resin, about 0.45 percent by weight of sulfonate as a photoacid generator, and about 94.55 percent by weight of an organic solvent comprising propylene glycol methyl ether and ethyl lactate in a weight ratio of about 8:2. The photosensitive resin included a bis-dimethyl butyl group and an isobutyl group as terminal groups and had a weight average molecular weight of about 9,100.

COMPARATIVE EXAMPLE

A photoresist composition was prepared by mixing about 5 percent by weight of methacrylate resin as a photosensitive resin, about 0.45 percent by weight of sulfonate as a photoacid generator, and about 94.55 percent by weight of an organic solvent comprising propylene glycol methyl ether and ethyl lactate in a weight ratio of about 8:2. The photosensitive resin included hydrogen and an isobutyl group as terminal groups and had a weight average molecular weight of about 9,000.

Evaluation of a Photoresist Pattern

A substrate including an anti-reflection film having a thickness of about 600 Å was prepared. Photoresist films having thicknesses of about 2,700 Å were formed on the substrate by coating photoresist compositions prepared in Example and Comparative Example, respectively. The photoresist films were selectively exposed to light using a laser of argon fluoride (ArF) having a wavelength of about 193 nm. Then, an exposed portion of the photoresist films was removed using a developing solution. A cleaning process and a drying process for removing a remaining developing solution were performed for the substrate to form a photoresist pattern. A line edge roughness in the photoresist pattern was measured using a scanning electron microscope (SEM).

Figure 4:
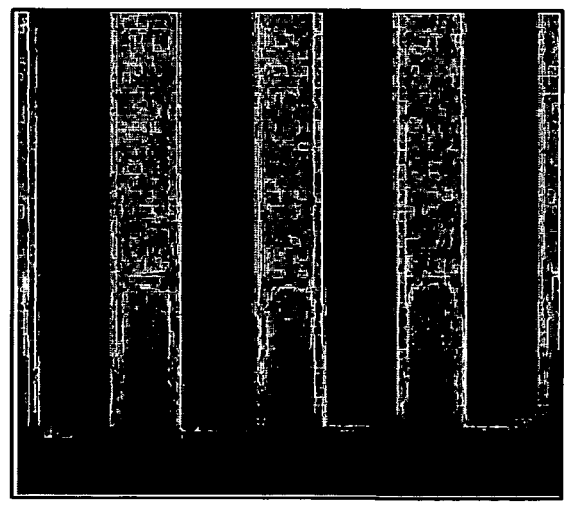
FIGS. 4 and 5 are SEM pictures illustrating photoresist patterns formed using the photoresist composition prepared in Example and Comparative Example.
Figure 5:
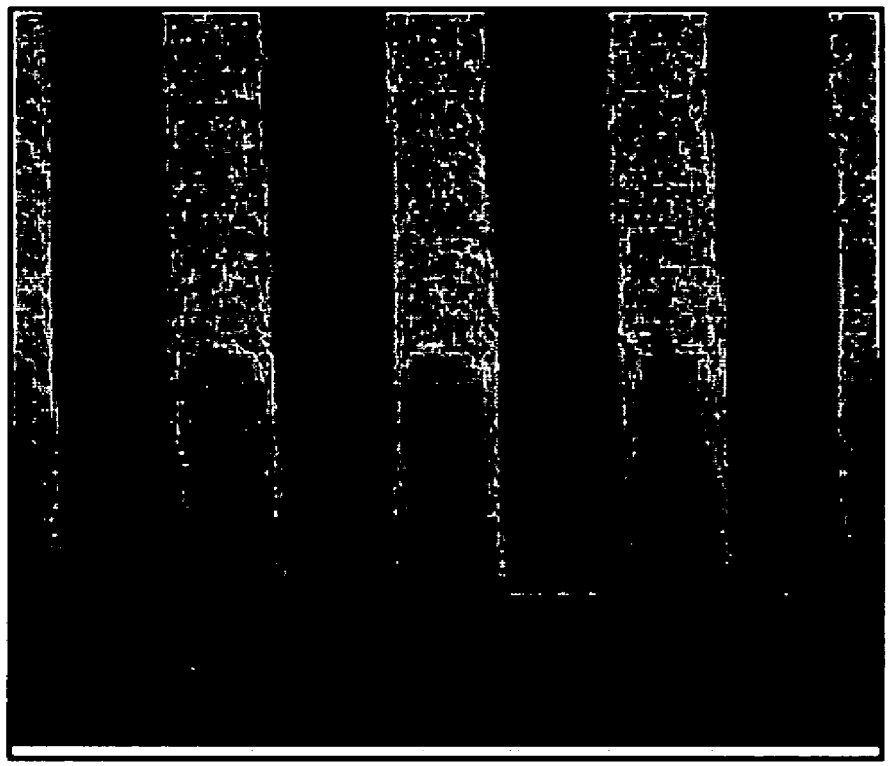

FIG. 4 is a SEM picture illustrating a photoresist pattern formed using the photoresist composition prepared in Example. FIG. 5 is a SEM picture illustrating a photoresist pattern formed using the photoresist composition prepared in Comparative Example.

Referring to FIG. 4, when the photoresist pattern was formed using the photoresist composition prepared in Example, a sufficient depth of focus was ensured. In addition, the photoresist pattern in the Example had an improved line edge roughness compared with that of Comparative Example. That is, when the photoresist pattern was formed using the photoresist composition of the present invention, the photoresist pattern had an improved line edge roughness and a more uniform profile. Therefore, when a structure pattern is formed using the photoresist pattern formed by the photoresist composition of the present invention, the structure pattern may also have a more uniform profile.

Referring to FIG. 5, when the photoresist pattern was formed using the photoresist composition prepared in Comparative Example, a sufficient depth of focus was ensured. However, the photoresist pattern in FIG. 5 had a deteriorated line edge roughness. Thus, when a structure pattern was formed using the photoresist pattern formed by the photoresist composition prepared in Comparative Example as an etching mask, the structure pattern had a deteriorated profile.

According to the present invention, when a photoresist pattern was formed using a photoresist composition of the present invention, the photoresist pattern had improved characteristics. Thus, the photoresist pattern had a reduced line edge roughness and the photoresist pattern had a fine line width which was more accurately formed. In addition, the photoresist pattern having a more uniform thickness may be obtained. Therefore, defects generated in semiconductor devices may be prevented and the productivity of a semiconductor manufacturing process may be enhanced in the photoresist composition of this invention.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A photosensitive resin comprising:
   a hydrophobic terminal group having at least five carbon atoms; and
   a blocking group,
   the photosensitive resin having a weight average molecular weight of about 6,000 to about 9,500.

2. The photosensitive resin of claim 1, wherein the hydrophobic terminal group is selected from the group consisting of a chain hydrocarbon group, an aromatic hydrocarbon group, an alkyl group, a chain hydrocarbon group having an oxyalkylene group, an aromatic hydrocarbon group having an oxyalkylene group, and combinations thereof.

3. The photosensitive resin of claim 1, wherein the hydrophobic terminal group includes at least one selected from the group consisting of hydrophobic groups represented by the following formulas (1) to (6):

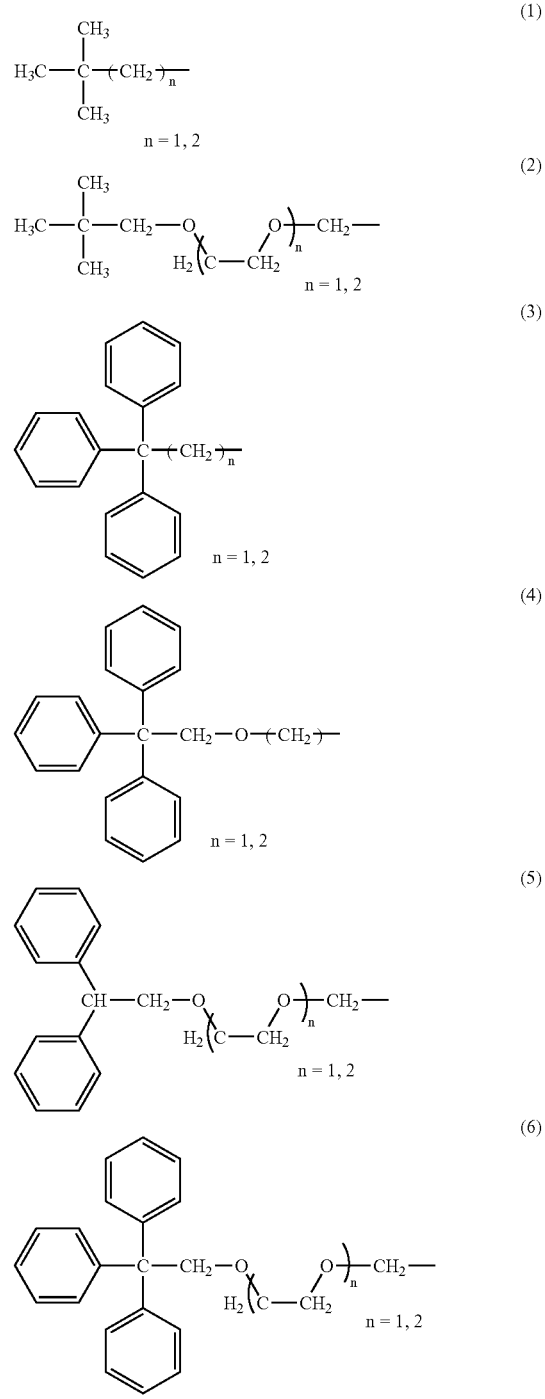

4. The photosensitive resin of claim 1, wherein the photosensitive resin has a weight average molecular weight of about 6,300 to about 8,500.

5. The photosensitive resin of claim 1, wherein the photosensitive resin includes at least one selected from the group consisting of an acrylate resin, a vinyl ether maleic anhydride (VEMA) resin, a cyclo olefin maleic anhydride (COMA) resin and a cyclo olefin(CO) resin.

6. The photosensitive resin of claim 1, wherein the photosensitive resin includes polymers having a grain size of about 15 nm to about 20 nm.

7. A photoresist composition comprising:
a photosensitive resin including at least five carbon atoms and a blocking group, the photosensitive resin having a weight average molecular weight of about 6,000 to about 9,500;
a photoacid generator; and
an organic solvent.

8. The photoresist composition of claim 7, wherein the hydrophobic terminal group includes at least one selected from the group consisting of hydrophobic groups represented by the following formulas (1) to (6):

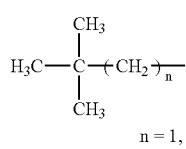
(1)

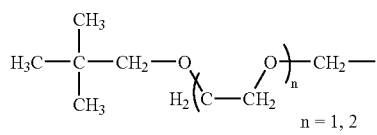
(2)

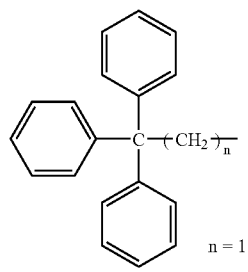
(3)

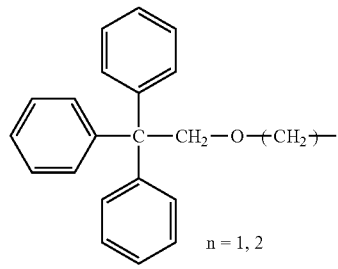
(4)

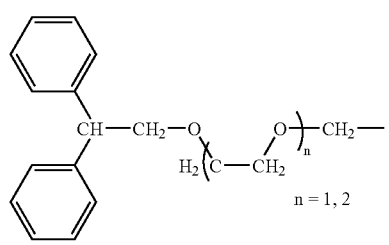
(5)

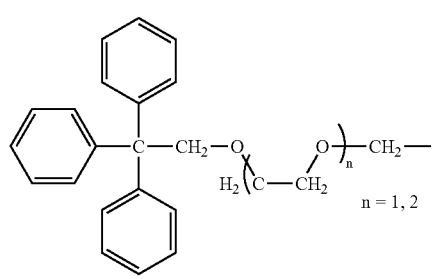
(6)

9. The photoresist composition of claim 7, wherein the photosensitive resin has a weight average molecular weight of about 6,300 to about 8,500.

10. The photoresist composition of claim 7, wherein the photosensitive resin includes at least one selected from the group consisting of an acrylate resin, a vinyl ether maleic anhydride (VEMA) resin, a cyclo olefin maleic anhydride (COMA) resin and a cyclo olefin (CO) resin.

11. The photoresist composition of claim 7, wherein the photoresist composition comprises about 4 to about 10 percent by weight of the photosensitive resin, about 0.1 to about 1 percent by weight of the photoacid generator and a remainder of the organic solvent.

12. The photoresist composition of claim 7, wherein the photoacid generator is selected from the group consisting of triarylsulfonium salt, diaryliodonium salt, sulfonate, N-hydroxysuccinimide triflate, and combinations thereof.

13. The photoresist composition of claim 7, wherein the organic solvent is selected from the group consisting of ethyleneglycolmonomethylether, ethyleneglycolmonoethylether, propyleneglycolmethylether, methylcellosolveacetate, ethylcellosolveacetate, diethyleneglycolmonomethylether, diethyleneglycolmonoethylether, propyleneglycolmethyletheracetate, propyleneglycolpropyletheracetate, diethyleneglycoldimethylether, ethyl lactate, toluene, xylene, methylethylketone, cyclohexanone, 2-heptanone, 3-heptanone, 4-heptanone, and combinations thereof.

14. The photoresist composition of claim 7, wherein the photosensitive resin includes polymers having a grain size of about 15 nm to about 20 nm.

15. A method of a photoresist pattern comprising:
forming a photoresist film on an object by coating a photoresist composition that includes the photosensitive resin, a photoacid generator and an organic solvent, wherein the photosensitive resin includes a blocking group and a hydrophobic terminal group that has at least five carbon atoms, and has a weight average molecular weight of about 6,000 to about 9,500;
exposing the photoresist film to light; and
developing an exposed portion of the photoresist film.

16. The method of claim 15, wherein the hydrophobic terminal group is selected from the group consisting of a chain hydrocarbon group, an aromatic hydrocarbon group, an alkyl group, a chain hydrocarbon group having an oxyalkylene group, an aromatic hydrocarbon group having an oxyalkylene group, and combinations thereof.

17. The method of claim 15, wherein the hydrophobic terminal group includes at least one selected from the group consisting of hydrophobic groups represented by the following formulas (1) to (6):

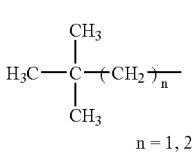
(1)

-continued
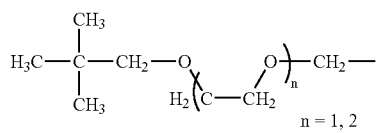
(2)
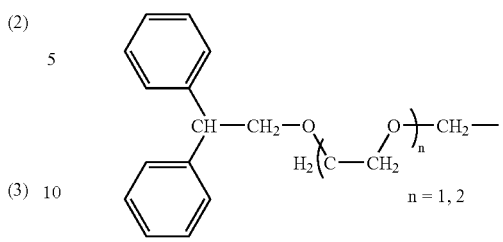
(5)
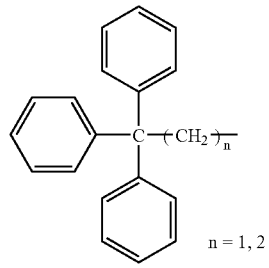
(3)
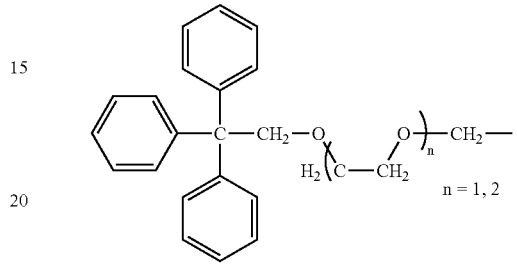
(6)
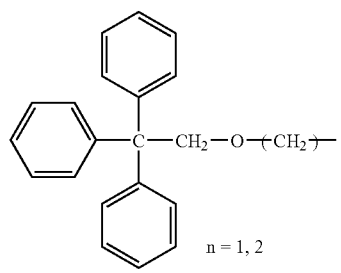
(4)
18. The method of claim 15, wherein the photosensitive resin includes polymers having a grain size of about 15 nm to about 20 nm.
19. The method of claim 15, wherein the photoresist composition comprises about 4 to about 10 percent by weight of the photosensitive resin, about 0.1 to about 1 percent by weight of the photoacid generator and a remainder of the organic solvent.
* * * * *